US007236398B1

(12) United States Patent
Smolen et al.

(10) Patent No.: US 7,236,398 B1
(45) Date of Patent: Jun. 26, 2007

(54) STRUCTURE OF A SPLIT-GATE MEMORY CELL

(75) Inventors: Richard G. Smolen, Redwood City, CA (US); Myron Wai Wong, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/218,214

(22) Filed: Aug. 31, 2005

(51) Int. Cl.
*G11C 16/04* (2006.01)

(52) U.S. Cl. .......................... 365/185.14; 365/185.28; 365/185.29

(58) Field of Classification Search ........... 365/185.14, 365/185.28, 185.29
See application file for complete search history.

(56) References Cited

U.S. PATENT DOCUMENTS

| 4,783,766 A | * | 11/1988 | Samachisa et al. .... 365/185.12 |
| 5,471,422 A | * | 11/1995 | Chang et al. .......... 365/185.26 |
| 6,114,724 A | * | 9/2000 | Ratnakumar ................ 257/326 |
| 6,284,601 B1 | * | 9/2001 | Hoang ........................ 438/258 |

* cited by examiner

*Primary Examiner*—Hoai V. Ho
(74) *Attorney, Agent, or Firm*—Morgan, Lewis & Bockius LLP (57) ABSTRACT

A split-gate memory cell includes a memory transistor and a select transistor. The memory transistor includes a drain, a source, a control gate and a floating gate. The select transistor includes a drain, a source and a select gate. The source of the select transistor is electrically connected to the drain of the memory transistor. The threshold state of the floating gate of the memory transistor determines the logic output of the memory cell. When the split-gate memory cell is erased or programmed a high voltage is only applied to the control gate and source of the memory transistor. As a result, no high voltage will be placed on any portion of the select transistor and the split-gate memory cell can achieve an increased cycling endurance.

9 Claims, 7 Drawing Sheets

FIG. 3

STRUCTURE OF A SPLIT-GATE MEMORY CELL

FIELD OF THE INVENTION

The present invention relates generally to the field of integrated circuit (IC) design and manufacture, and in particular, to the structure of a split-gate memory cell.

BACKGROUND

An efficient memory cell should complete routine operations within a minimum amount of time. One way of improving a memory cell's efficiency is to apply a high voltage to the memory cell so that it takes less time, e.g., to erase the content stored in the memory cell. However, a high voltage applied to the memory cell may damage the gate oxide of the memory cell and therefore reduce the memory cell's durability. A more durable memory cell is especially advantageous to storage devices like electrically erasable programmable read-only memory (EEPROM) and flash memory, which are widely used in various embedded applications such as field-programmable gate arrays (FPGA) or complex programmable logic device (CPLD). Accordingly, it is desirable to develop a new memory cell structure that is both efficient and durable.

SUMMARY

In a preferred embodiment of the present invention, a split-gate memory cell includes a memory transistor and a select transistor. The memory transistor includes a drain, a source, a control gate and a floating gate. The select transistor includes a drain, a source and a select gate. The source of the select transistor is electrically connected to the drain of the memory transistor through an N+ diffusion. The threshold state of the floating gate of the memory transistor determines the logic output of the memory cell. When the split-gate memory cell is erased or programmed, a high voltage is only applied to the control gate and source of the memory transistor. As a result, there is no need to place a high voltage on the select gate transistor that might damage the select transistor and the split-gate memory cell achieves a better cycling endurance.

BRIEF DESCRIPTION OF THE DRAWINGS

The aforementioned aspects of the invention as well as additional aspects will be more clearly understood as a result of the following detailed description of the various embodiments of the invention when taken in conjunction with the drawings. Like reference numerals refer to corresponding parts throughout the several views of the drawings.

DESCRIPTION OF EMBODIMENTS

As mentioned in the background section, different performance-related objectives such as efficiency and durability may impose contradictory requirements upon a memory cell in an EEPROM chip. One object of the present invention is to resolve the potential conflicts without hurting the memory cell's overall performance. However, in order to better appreciate the present invention, it is necessary to examine the structure and operation of a prior art memory cell.

Figure 1A:
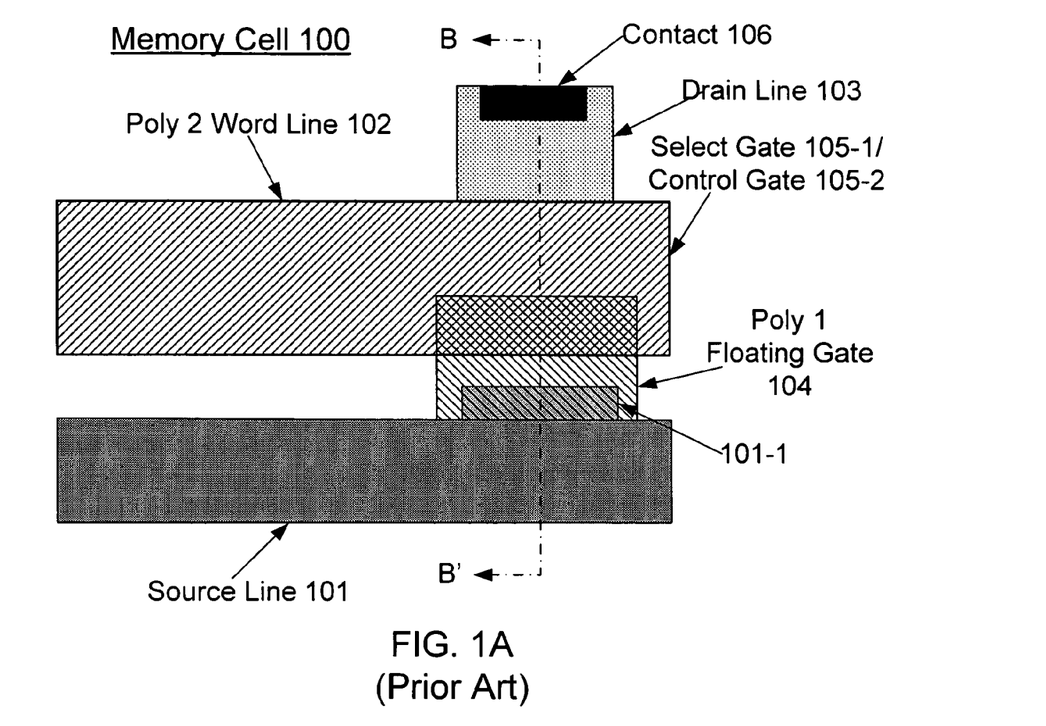
FIG. 1A is a top view illustrating the physical structure of a prior art split-gate memory cell.

FIG. 1A is a top view illustrating the physical structure of a prior art split-gate memory cell. Memory cell 100 includes a source line 101, a Poly 2 word line 102, a drain line 103 and a Poly 1 floating gate 104. Note that the Poly 1 floating gate 104 partially overlaps the Deep N+ source line diffusion 101-1 and the Poly 2 word line 102. The portion of the Poly 2 word line 102 close to the Poly 1 floating gate 104 and the drain line 103 corresponds to the select gate 105-1/control gate 105-2 of the memory cell 100. A metal contact 106 on the drain line 103 wires the drain line 103 of this memory cell with other memory cells in the same chip.

Figure 1B:
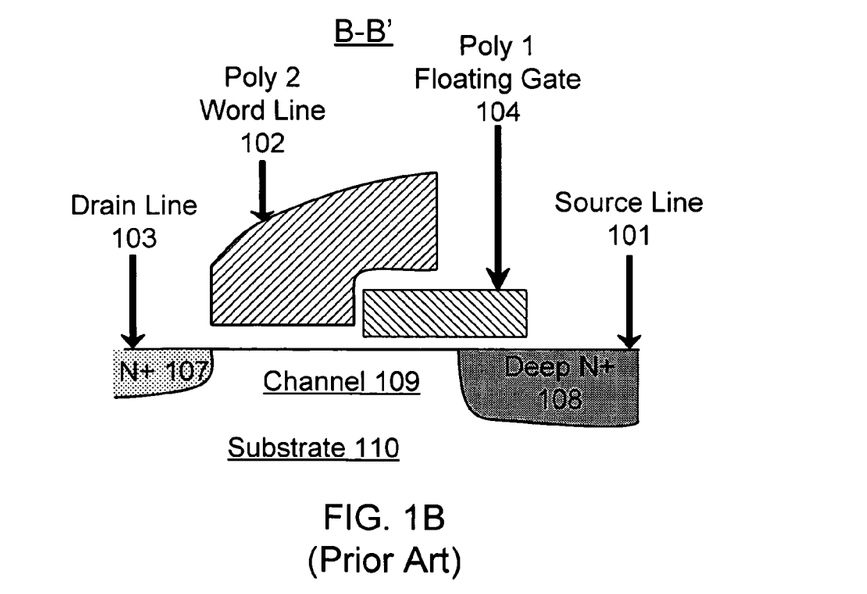
FIG. 1B is a cross-sectional view illustrating the physical structure of the prior art split-gate memory cell.

FIG. 1B is a cross-sectional view illustrating the physical structure of the prior art split-gate memory cell along line B–B' in FIG. 1A. Two diffusion regions in the substrate 110, "N+" 107 and "Deep N+" 108, serve as the drain and source of the memory cell 100, respectively. A channel 109 extends between the two diffusion regions in the substrate 110. Both the Poly 2 word line 102 and the Poly 1 floating gate 104 are separated from the channel 109 in the substrate 110 by a thin layer of gate oxide (not shown). The Poly 1 floating gate 104 is separated from the Poly 2 word line 102 by a layer of inter-Poly oxide between the two components (not shown).

Figure 1C:
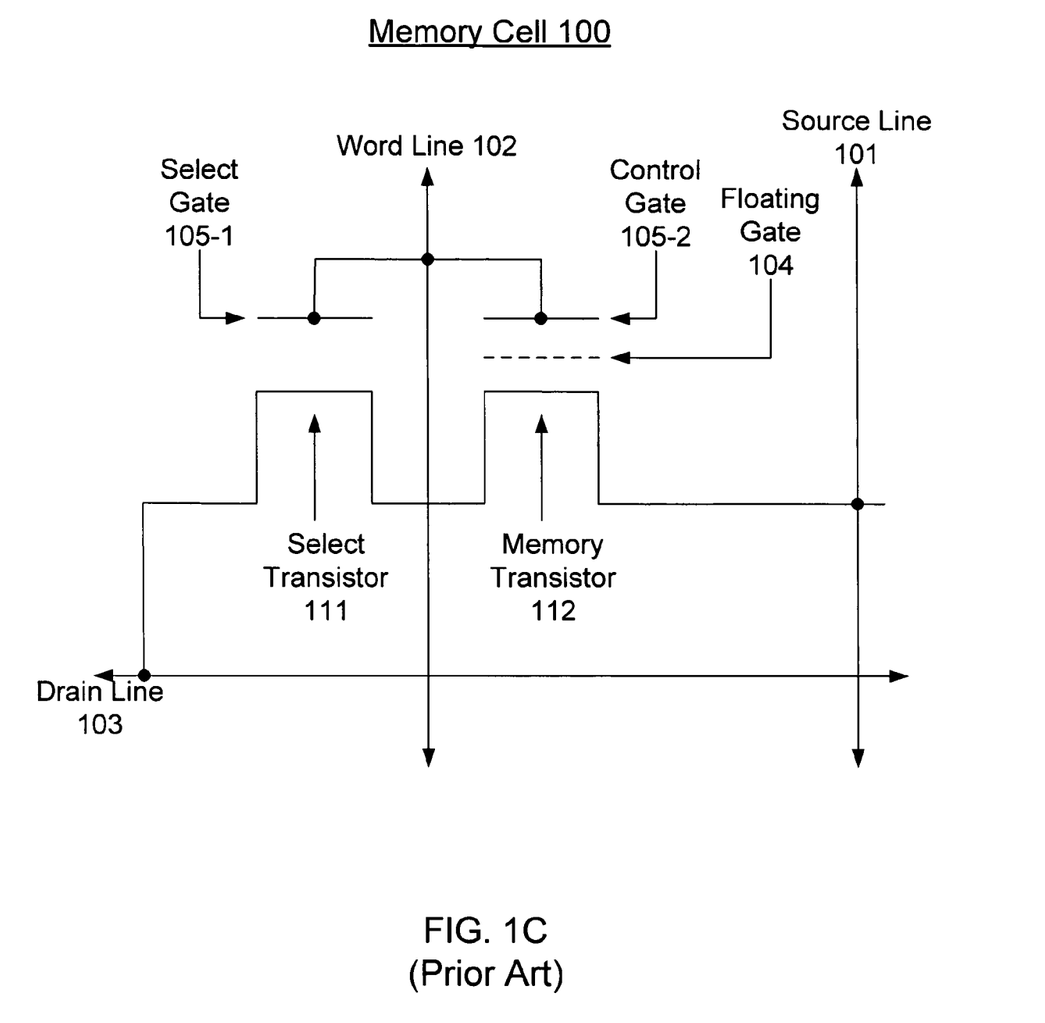
FIG. 1C is a diagram illustrating the logical structure of the prior art split-gate memory cell.

While the physical embodiment of the prior art split-gate memory cell has a single source and a single drain, the split-gate memory cell can be logically thought of as a combination of a select transistor and a memory transistor, each having a source, a drain, and a gate, as shown in FIG. 1C. The select transistor 111 and the memory transistor 112 are connected in series between the drain line 103 and the source line 101 with the source of the select transistor 111 being connected to the drain of the memory transistor 112. The word line 102 is connected to both the select gate 105-1 of the select transistor 111 and the control gate 105-2 of the memory transistor 112. The floating gate 104 is part of the memory transistor 112. The memory transistor 112 is in either high or low threshold state (representing logic "0" or "1", respectively) depending on the amount of stored electric charge on the floating gate. The voltages applied to each individual terminal during the normal operations of the memory cell are listed below in Table 1.

TABLE 1

Voltage levels applied to Drain Line, Word Line and Source Line

| | Drain Line | Word Line | Source Line |
|---|---|---|---|
| Program (Select/Unselect) | $V_{Low}/V_{CC}$ | $V_T/V_{SS}$ | $V_{High}/V_{High}$ |
| Erase | $V_{SS}$ | $V_{High}$ | $V_{SS}$ |
| Read | ~1V | $V_{REF}$ | $V_{SS}$ |

During a normal "Read" cycle, the source line 101 is grounded, a voltage of about one volt is applied to the drain line 103, and a reference voltage $V_{REF}$ is applied to the control gate 105-2 and the select gate 105-1 via the word line 102. The reference voltage $V_{REF}$ is high enough to turn on the select gate portion of the channel. In some embodiments, it is approximately one volt higher than the power voltage $V_{CC}$.

If the memory cell is programmed, the floating gate 104 is in a high threshold state because there is a significant accumulation of negative charge on the floating gate 104. As a result, the memory transistor portion of the channel does not conduct since the reference voltage $V_{REF}$ applied to the control gate 105-2' is not sufficiently high to push positive charge away from the upper part of the channel. In practice, a non-conducting state of the memory transistor portion of the channel is designated as logic "0".

If the memory cell is erased, the floating gate 104 is in a low or negative threshold state because there is not a significant accumulation of negative charge on the floating gate 104. In this case, the reference voltage $V_{REF}$ applied to the word line 102 turns on the memory transistor portion of the channel. In practice, the conducting state of the memory transistor portion of the channel is designated as logic "1".

The erasing of a programmed memory cell requires that the negative charge accumulated on the floating gate be released. To do so, both the source line and drain line of the memory cell are grounded and its word line is raised to a high voltage $V_{High}$. In some embodiments, this high voltage $V_{High}$ is approximately 12V to 15V. The low coupling ratio between the control gate and the floating gate provides a significant $\Delta V$ across the inter-Poly oxide, generating a local high electric field accordingly along the edge of the floating gate near the control gate. Once the electric field reaches a predefined magnitude, negative charge starts moving from the floating gate to the control gate due to Fowler-Nordheim tunneling. Fowler-Nordheim tunneling is a quantum mechanical process whereby electrons tunnel through an oxide barrier in the presence of a high electric field. This tunneling process is an important mechanism associated with thin barriers such as those between poly and semiconductor junctions on highly-doped semiconductors, and also between two layers of poly. This charge transfer stops when there is a sufficient buildup of positive charge on the floating gate. This positive charge buildup raises the floating gate voltage to a level such that there is insufficient $\Delta V$ across the inter-Poly oxide to sustain Fowler-Nordheim tunneling.

The removal of negative charge leaves a net gain of positive charge on the floating gate. This positive charge on the floating gate decreases the memory cell's threshold voltage such that the memory cell will conduct under the reference voltage $V_{REF}$ during a Read cycle. As a result, the output of this memory cell switches from logic "0" to logic "1".

The programming of a memory cell uses high efficiency source-side channel hot electron (CHE) injection. Channel hot electron injection occurs when the source voltage of a transistor is significantly higher than both the gate voltage and the drain voltage of the transistor. Because of the capacitive coupling effect between the source at a high voltage and the floating gate, channel hot electrons that travel from the drain to the source are sometimes driven towards the floating gate even before they reach the source.

When a memory cell is selected for programming, a low voltage $V_{Low}$ is placed on its drain line, a voltage higher than or equal to the threshold voltage $V_T$ of the select transistor is applied to the control gate via its word line, and a high voltage $V_{High}$ is applied to the source line. In some embodiments, the low voltage $V_{Low}$ is about 0.2V to 0.8V and the high voltage $V_{High}$ is about 10V to 13V. The voltage differential between the word line and the drain line of the selected memory cell is sufficiently high to turn on the select gate portion of the channel. The high voltage $V_{High}$ at the source line is capacitively coupled to the floating gate. As a result, the electric field between the floating gate and the channel efficiently sweeps to the floating gate almost all channel hot electrons generated by the high source-to-drain voltage differential.

The transfer of channel hot electrons is eventually stopped as negative charge accumulates on the floating gate. The addition of the negative charge to the floating gate neutralizes the positive charge generated during an erasing cycle. As a result, a memory cell selected for programming becomes non-conducting when the reference voltage $V_{REF}$ is applied during a Read cycle and the output of this memory cell switches from logic "1" to logic "0" while the output of an unselected memory cell remains at logic "1".

Figure 1D:
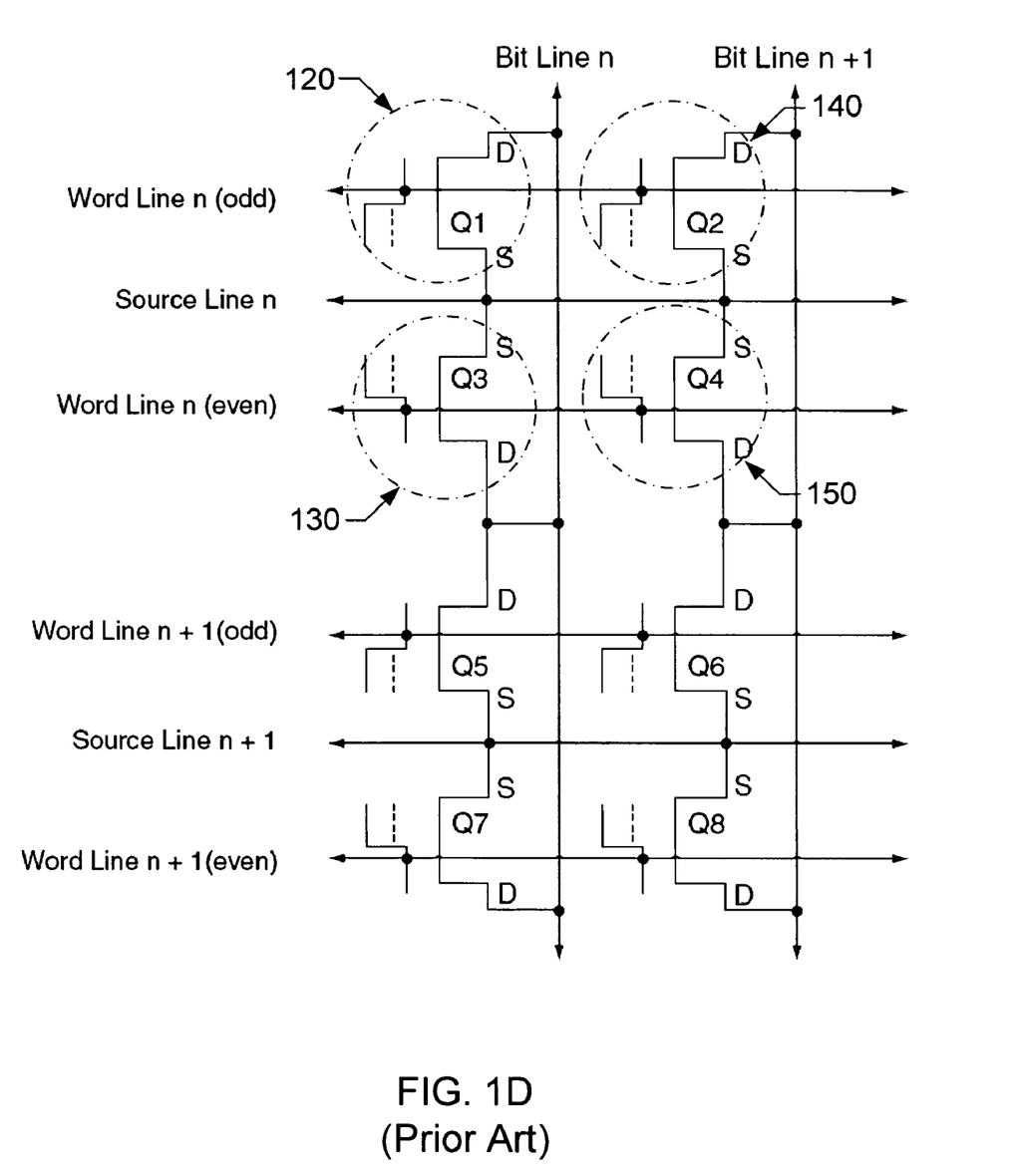
FIG. 1D is a diagram illustrating the logical organization of an array of the prior art split-gate memory cells.

FIG. 1D illustrates the logical organization of an array of the prior art split-gate memory cells. This illustration represents a section of a typical cross-point memory array, arranged as 8 memory cells in 2 columns (bit lines "n" and "n+1"), 2 source lines "n" and "n+1", and 4 word lines (rows). Note that each word line is split into an even and odd row, which isolates each source line from all other source lines on the array.

One issue with the structure of split-gate memory cell 100 is that the thin layer of gate oxide separating the Poly 2 word line and the channel may be damaged by repeated high voltage stress associated with the erase operations. Because of this damage, the number of cycles the split-gate memory cell 100 can attain prior to a punch through breakdown failure, or a program disturb failure, is significantly reduced. For example, the cycling endurance of the split-gate memory cell 100 rarely reaches the industry standard, e.g., 20K cycles. When deployed in an application which requires high cycling endurance, an EEPROM chip has to reserve certain die area to incorporate supporting circuits designed specifically to improve its cycling endurance. This approach not only increases the size of the chip but also complicates the circuit design.

Of course, the gate oxide is less damaged if the voltage level at the select gate is limited during erase operations. This approach, however, has an adverse impact on the performance of the memory cell. The lower the voltage level, the lower the electric field along the edge of the floating gate near the control gate. It thus requires more time to move the same amount of negative charge from the floating gate to the control gate using Fowler-Nordheim tunneling during an erase cycle. In other words, the extension of the cycling endurance of a split-gate memory cell by lowering the voltage level is achieved only at the price of less efficient operations.

Another problem with the structure of split-gate memory cell 100 is the so-called "program disturb" phenomenon, i.e., where a different memory cell other than the one targeted for programming is altered accidentally. Disturbs may occur whenever a high voltage is applied to the gate or source of a memory cell that is not the target of an erase or program operation. As indicated in Table 1, when a high voltage is applied to the source line of a split-gate memory cell being programmed, it may adversely affect adjacent memory cells.

Referring again to the array of memory cells in FIG. 1D, assume that memory cell 120 is selected during a programming cycle while its neighboring memory cells 130, 140 and 150 are the inhibited erased cells. According to Table 1, the voltage levels at the gate, source and drain lines of memory cells 120, 130, 140 and 150 are listed below in Table 2:

TABLE 2

Voltage levels applied to memory cells 120, 130, 140 and 150

|  | Drain Line | Word Line | Source line |
|---|---|---|---|
| Memory Cell 120 (Selected) | $V_{Low}$ | $V_T$ | $V_{High}$ |
| Memory Cell 130 (Unselected) | $V_{Low}$ | $V_{SS}$ | $V_{High}$ |
| Memory Cell 140 (Unselected) | $V_{CC}$ | $V_T$ | $V_{High}$ |
| Memory Cell 150 (Unselected) | $V_{CC}$ | $V_{SS}$ | $V_{High}$ |

Taking memory cell 130 for example, if there is any gate oxide damage that significantly reduces the turn-on voltage $V_T$ of the select transistor, the negative bias from the select gate to the drain line will not be large enough to turn off the select transistor. The leakage current from the source line to the drain line will partially program the inhibited erased memory cell 130 by accident. Other memory cells 140 and 150 adjacent cell 120 are subject to similar risks of being accidentally programmed, although to a lesser degree.

Although limiting the voltage level during a programming cycle can reduce the probability of punch through failure and program disturb failure, it prolongs the programming time, rendering the memory cell less efficient.

FIGS. 2A–2D depict new physical and logical structures of a split-gate memory cell that avoids the problems mentioned above and has better performance than the prior art split-gate memory cell.

Figure 2A:
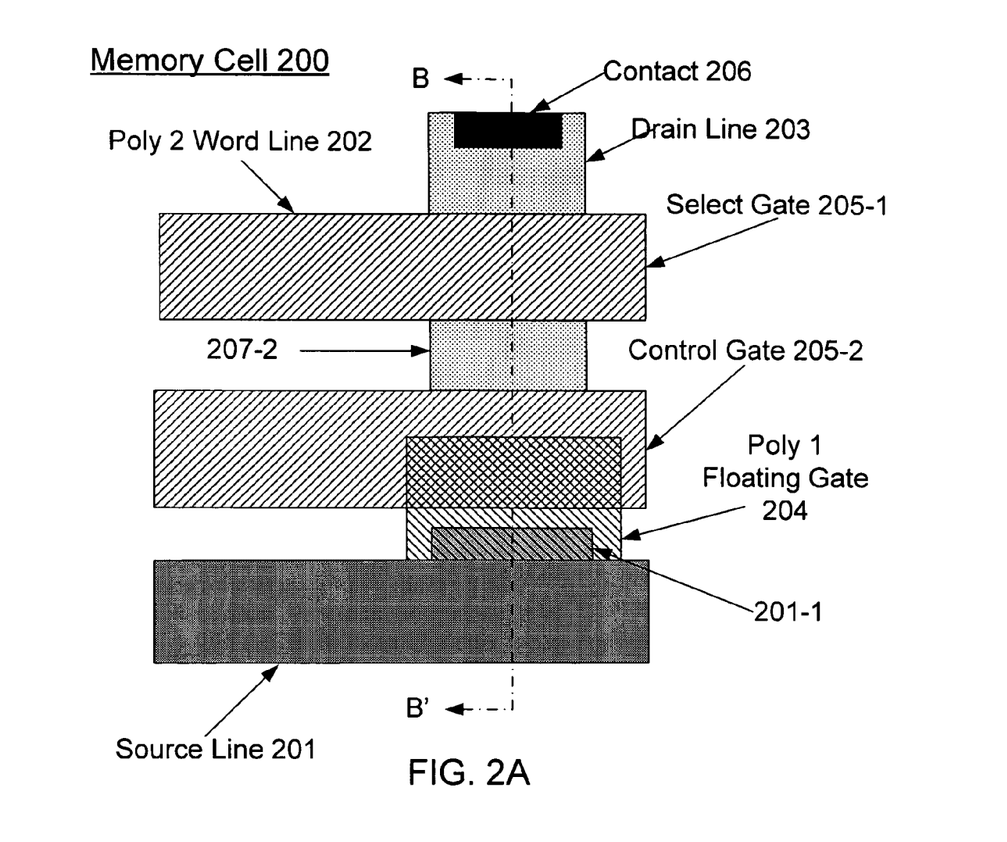
FIG. 2A is a top view illustrating the physical structure of a split-gate memory cell according to some embodiments of the present invention.

FIG. 2A is a top view illustrating the physical structure of the new split-gate memory cell according to some embodiments of the present invention. Memory cell 200 includes a source line 201, a Poly 2 word line 202, a drain line 203, a Poly 1 floating gate 204 and a control gate 205-2. The Poly 1 floating gate 204 partially overlaps a deep N+ source line diffusion 201-1 associated with the source line 201 and the control gate 205-2 partially overlaps the Poly 1 floating gate 204. A metal contact 206 on the drain line 203 wires the drain line 203 of this memory cell with other memory cells in the same chip. One distinction between memory cell 200 in FIG. 2A and memory cell 100 in FIG. 1A is that a select gate 205-1 on the Poly 2 word line 202 and the control gate 205-2 of memory cell 200 are two pieces of polysilicon that are separated by an additional diffusion region "N+" 207-2 in substrate 201. The select gate 205-1 does not overlap the Poly 1 floating gate 204. In contrast, the two gates 105-1 and 105-2 of memory cell 100 correspond to a single piece of polysilicon in FIG. 1A.

Figure 2B:
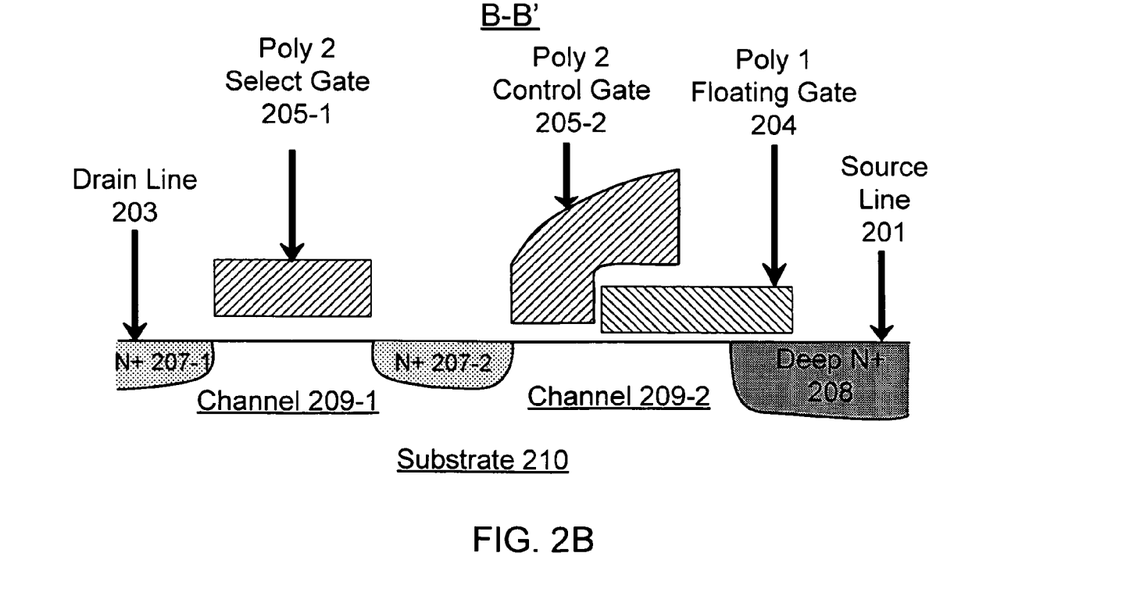
FIG. 2B is a cross-sectional view illustrating the physical structure of the split-gate memory cell according to some embodiments of the present invention.

FIG. 2B is a cross-sectional view of the split-gate memory cell 200 along line B–B' in FIG. 2A. Three diffusion regions are generated in the substrate 210. The leftmost diffusion region "N+" 207-1 and the rightmost diffusion region "Deep N+" 208 serve as the drain and source of the memory cell, respectively, and the diffusion region "N+" 207-2 in the middle separates the select gate 205-1 from the control gate 205-2. A first channel 209-1 extends between the leftmost diffusion region "N+" 207-1 and the central diffusion region "N+" 207-2 and a second channel 209-2 extends between the central diffusion region "N+" 207-2 and the rightmost diffusion region "Deep N+" 208. A thin layer of gate oxide on the surface of the substrate 210 separates the select gate 205-1 and the control gate 205-2 from the channels in the substrate.

Figure 2C:
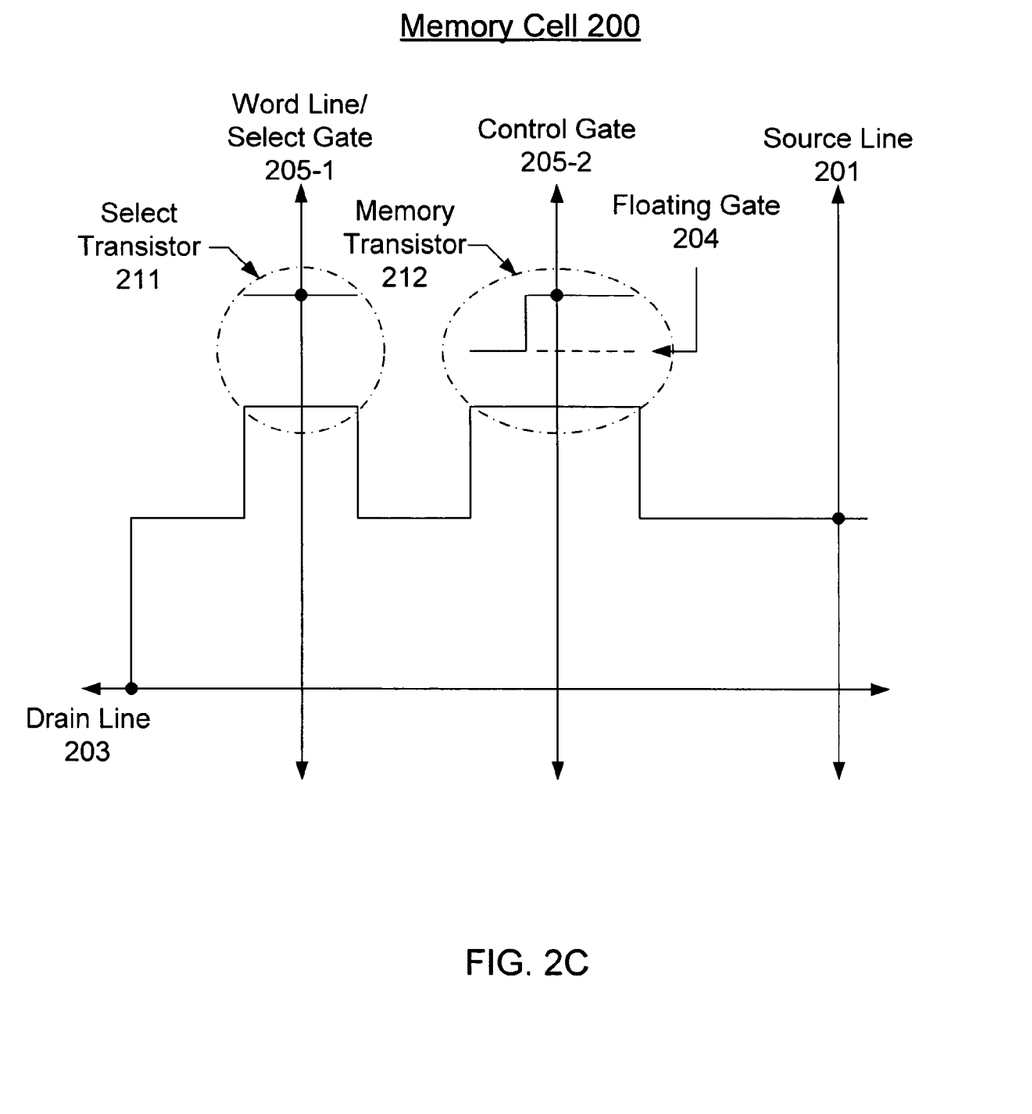
FIG. 2C is a diagram illustrating the logical structure of the split-gate memory cell according to some embodiments of the present invention.

FIG. 2C is a diagram illustrating the logical structure of the new split-gate memory cell. The select transistor 211 and the memory transistor 212 are connected in series between a drain line 203 and a source line 201 with the source of the select transistor 211 being connected to the drain of the memory transistor 212. The select transistor 211 has a select gate 205-1 while the memory transistor 212 has a control gate 205-2 and a floating gate 204. However, unlike what is shown in FIG. 1C, the select transistor 211 and memory transistor 212 in FIG. 2C no longer share a gate terminal, since each transistor has its own gate terminal. But the basic function of memory cell 200 is close to that of memory cell 100. For example, the value stored at the memory cell 200 depends on whether the memory transistor 212 is in high or low negative threshold state (representing logic "0" or "1", respectively).

The separation of the select gate 205-1 and the control gate 205-2 makes it possible to limit the impact of high voltage on the memory cell 200. More specifically, high voltage will only occur at the control gate 205-2, but no longer at the select gate 205-1. As a result, memory cell 200 is less likely to suffer gate oxide damage or program disturb and therefore has longer cycling endurance. Table 3 lists voltages applied to each individual terminal during the normal operations of memory cell 200.

TABLE 3

Voltages applied to Drain Line, Select Gate, Control Gate and Source Line.

|  | Drain Line | Select Gate | Control Gate | Source Line |
|---|---|---|---|---|
| Program (Select/Unselect) | $V_{Low}/V_{CC}$ | $V_T/V_{SS}$ | $V_{CC}/V_{SS}$ | $V_{High}/V_{High}$ |
| Erase | $V_{SS}$ | $V_{CC}$ | $V_{High}$ | $V_{SS}$ |
| Read | ~1V | $V_{CC}$ | $V_{REF}$ | $V_{SS}$ |

Since there is no high voltage involved, the operation of memory cell 200 is similar to that of memory cell 100 during a normal "Read" cycle. Specifically, the source line 201 is grounded and a voltage of about one volt is applied to the drain line 203. The power voltage $V_{CC}$ is high enough to turn on the select gate 205-1. Whether the reference voltage $V_{REF}$ can turn on the control gate 205-2 depends on whether the memory cell 200 is programmed.

If the memory cell 200 is programmed, the floating gate 204 is in a high threshold state due to the significant accumulation of negative charge on the floating gate. As a result, the memory transistor portion of the channel does not conduct because the reference voltage $V_{REF}$ applied to the control gate 205-2 is not sufficiently high to push positive charge away from the upper part of the channel. Therefore, the non-conducting memory cell outputs logic "0".

If the memory cell 200 is erased, the floating gate 204 is in a low or negative threshold state because the negative charge accumulated on the floating gate has disappeared during an erase cycle. In this case, the reference voltage $V_{REF}$ applied to the control gate 205-2, which is about one volt higher than the power voltage $V_{CC}$, can turn on the memory transistor portion of the channel. The conducting memory cell in turn outputs logic "1".

Like memory cell 100, both the source line and drain line of a programmed memory cell 200 are grounded to erase negative charge from its floating gate. A high voltage is applied to the control gate of the memory cell such that the low coupling ratio between the control gate and the floating gate provides a significant ΔV across the inter-Poly oxide. This voltage potential generates a local high electric field along the edge of the floating gate near the control gate. Once the electric field reaches a predefined magnitude, negative charge on the floating gate starts moving across the oxide and enters the control gate using Fowler-Nordheim tunneling. As a result, there is a buildup of positive charge on the floating gate, which raises the floating gate voltage to a level such that there is insufficient ΔV across the oxide to sustain the Fowler-Nordheim tunneling.

As mentioned above, when a programmed memory cell 100 is being erased, both its select gate and control gate are raised to the high voltage $V_{High}$. But when a programmed memory cell 200 is being erased, only the control gate is raised to a high voltage $V_{High}$ while the select gate is raised to a regular power voltage $V_{CC}$ high enough to turn on the select transistor. Therefore, the gate oxide at the select transistor is much less likely to be damaged by high voltage stress, resulting in an increased cycling endurance of the memory cell. For example, it is possible for the new split-gate memory cell 200 to achieve the industry standard of 20K cycles without any additional supporting circuit in the corresponding EEPROM chip.

Since the select gate is physically separated from the control gate by the central N+ diffusion region, it is possible to apply a voltage even higher than $V_{High}$ to the control gate during an erase cycle with no gate oxide damage to the select transistor. As a result, the memory cell may become more efficient because a higher erase voltage results in shorter erase time.

The programming of memory cell 200 utilizes the high efficiency source-side channel hot electron injection. The configuration of a memory cell 200 selected for programming is similar to that of memory cell 100. That is, a low voltage $V_{Low}$ is placed on its drain line, a threshold voltage $V_T$ is applied to the select gate to turn on the select transistor, a regular power voltage $V_{CC}$ is applied to the control gate to turn on the memory transistor, and a high voltage $V_{High}$ is applied to the source line. Since the high voltage $V_{High}$ at the source line is capacitively coupled to the floating gate, the high electric field between the floating gate and the channel efficiently sweeps to the floating gate almost all channel hot electrons generated by the high source-to-drain voltage differential.

But the additional diffusion region "N+" 207-2 between the select gate 205-1 and the control gate 205-2 (FIG. 2B) further separates the gate oxide under the select gate 205-1 from the source line 201. Even if the high voltage $V_{High}$ is placed on the source line 201, it is less likely to cause punch through breakdown failure. The intact gate oxide under the select gate 205-1 and the additional diffusion "N+" 207-2 between the select gate 205-1 and the control gate 205-2 make it possible to use an even higher program voltage at the source, rendering the memory cell more efficient. The probability of program disturb is also reduced for an unselected memory cell that is adjacent to memory cell 200.

Figure 2D:
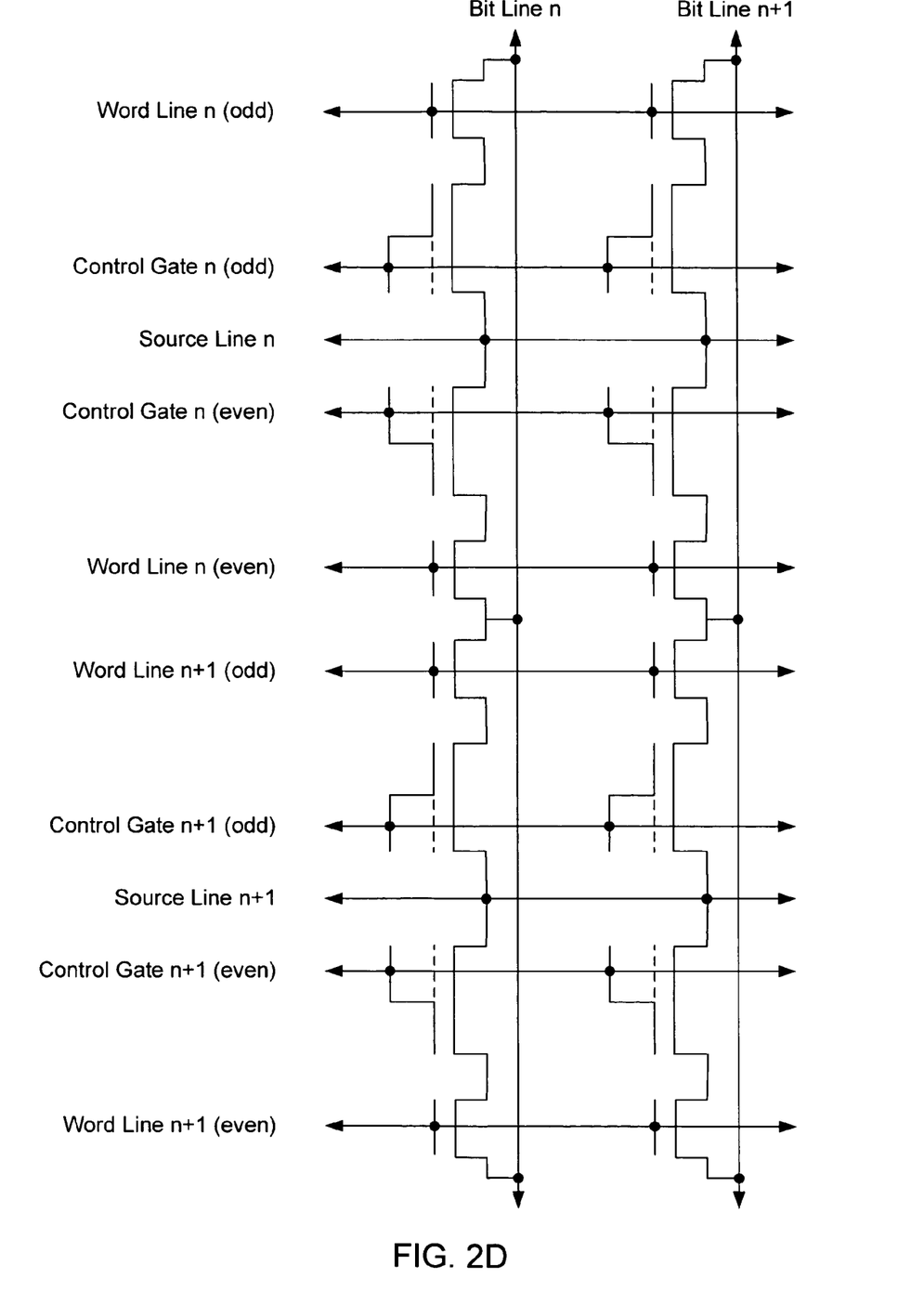
FIG. 2D is a diagram illustrating an array of the split-gate memory cell according to some embodiments of the present invention.

FIG. 2D illustrates the logical organization of an array of split-gate memory cells of the present invention. This illustration represents a section of a typical cross-point memory array, arranged as 8 memory cells in 2 columns (Bit Line "n" and Bit Line "n+1"), 2 source lines "n" and "n+1", 4 control gate rows and 4 select gate rows.

The new split-gate memory cell 200 has a better performance than the prior art memory cell 100, and is also easier to manufacture. Traditionally, in order to achieve uniform performance among memory cells on the same chip, the word line of each cell needs to be strictly aligned with the poly 1 region corresponding to the floating gate (see, e.g., FIG. 1B), because the misalignment between these two components may result in that different memory cells have different physical dimensions and thereby different cell currents as well as different cell performances. A better alignment between the word line and the floating gate may have to be achieved by using a high-quality (and therefore more expensive) photo mask, or to rework the alignment during manufacturing.

But the separation of the select gate and the control gate makes it possible to reduce the fluctuation of cell currents through the modulation of the select transistor, e.g., by adjusting the length of the channel and the thickness of the gate oxide under the select gate, controlling the minimum distance between the select gate and the control gate, or independently applying predetermined bias voltages to the select gate, the control gate and/or the drain line. A more uniform cell current implies that it takes less time to read a programmed or erased memory cell and less die area has to be reserved for manufacturing supporting circuits. This new structure for a split-gate memory cell no longer needs an expensive photo mask to ensure that the select gate and the control gate be strictly aligned with the floating gate.

Figure 3:
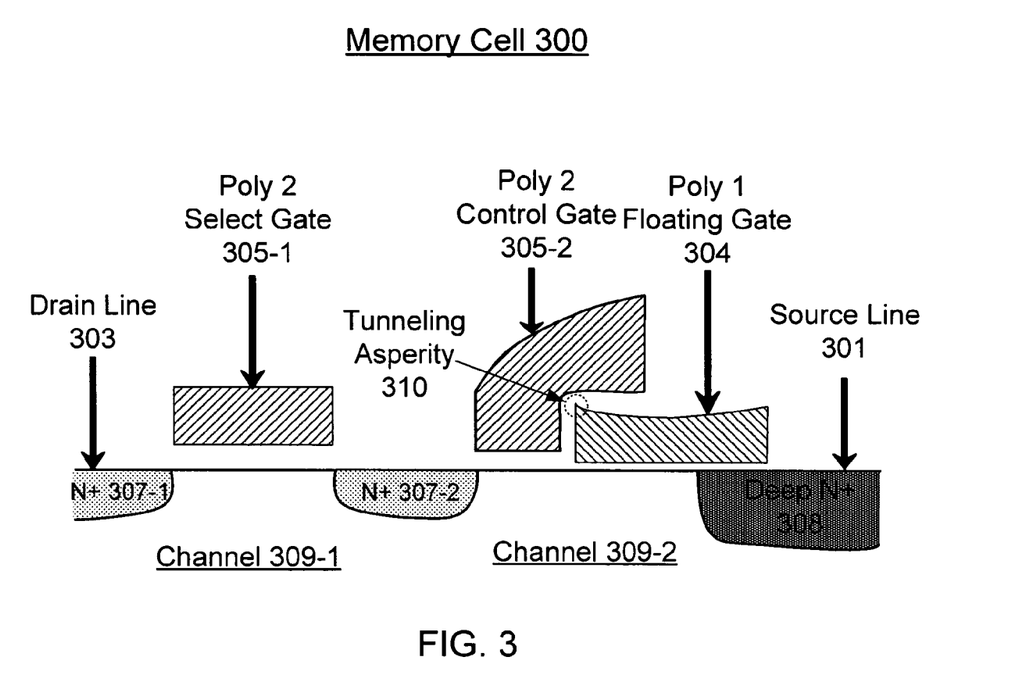
FIG. 3 is a cross-sectional view illustrating the physical structure of a split-gate memory cell according to an alternative embodiment of the present invention.

In an alternative embodiment shown in FIG. 3, a tunneling asperity 310 is located at the corner of the floating gate 304 near the control gate 305-2. The tunneling asperity 310 is formed by oxidation of the floating gate 304 followed by a reactive ion etching of the floating gate 304. When a high voltage $V_{High}$ is applied to the control gate 305-2, a local high electric field is generated along the edge of the tunneling asperity 310 to facilitate a faster negative charge transfer from the floating gate 304 to the control gate 305-2.

In general, the dimension of memory cell 200 is larger than that of memory cell 100 due to the separation of the select gate and the control gate and the addition of the central N+ diffusion region. But this small increase in the memory cell footprint is not a real concern in most of the embedded applications using FPGA or CPLD. For example, for a FPGA or CPLD having about 500K split-gate memory cells, the increase of die area occupied by the 500K split-gate memory cells using the new structure will be less than 1%.

The foregoing description, for purpose of explanation, has been set forth with reference to specific embodiments. However, the illustrative discussions above are not intended to be exhaustive or limit the invention to the precise forms disclosed. One skilled in the art will find that some requirements are optional. Still other variations will be obvious to one of ordinary skill in the art.

What is claimed is:

1. A memory cell, comprising:
   a memory transistor, the memory transistor including a drain, a source, a control gate and a floating gate; and
   a select transistor, the select transistor including a drain, a source and a select gate, the source of the select transistor electrically connected to the drain of the memory transistor and the select gate of the select transistor being separated from the control gate of the memory transistor, wherein the memory cell is erased by applying a first voltage to the control gate and applying a second voltage to the select gate, the first voltage being higher than the second voltage, wherein the second voltage applied to the select gate is at or above a first voltage level necessary for turning on the select transistor and below a second voltage level that may damage the select transistor.

2. A memory cell, comprising:
a memory transistor, the memory transistor including a drain, a source, a control gate and a floating gate; and
a select transistor, the select transistor including a drain, a source and a select gate, the source of the select transistor electrically connected to the drain of the memory transistor and the select gate of the select transistor being separated from the control gate of the memory transistor, wherein the memory cell is programmed by applying a first voltage to the source of the memory transistor, applying a second voltage to the control gate, and applying a third voltage to the select gate, the first voltage being higher than the second voltage and the second voltage being higher than the third voltage.

3. The memory cell of claim 2, wherein the third voltage applied to the select gate is at or above a first voltage level necessary for turning on the select transistor and below a second voltage level that may damage the select transistor.

4. A memory cell, comprising:
a source line in a substrate;
a drain line in the substrate;
a control gate above the substrate and between the source lime and the drain line;
a floating gate above the substrate and partially overlapping the control gate and the source line;
a select gate above the substrate and between the drain line and the control gate; and
a diffusion region in the substrate separating the select gate from the control gate, wherein the select gate is separated from the substrate by a gate of oxide, wherein the memory cell is programmed by applying a first voltage to the source line, a second voltage to the control gate, and a third voltage to the select gate, the first voltage being higher than the second voltage and the second voltage being higher than the third voltage.

5. The memory cell of claim 4, wherein the third voltage applied to the select gate is below a first voltage level that may damage the gate oxide and at or above a second voltage level necessary for turning a channel under the select gate.

6. The memory cell of claim 4, wherein the third voltage applied to the select gate is below a first voltage level that may damage the gate oxide and at or above a second voltage level necessary for forming a channel under the select gate.

7. The memory cell of claim 4, wherein the diffusion region has a minimum length necessary for preventing the first voltage applied to the source line from damaging the gate oxide.

8. The memory cell of claim 4, wherein the diffusion region has a minimum length necessary for preventing the first voltage applied to the source line from damaging the gate oxide.

9. A programmable logic device, comprising:
multiple memory cells, each memory cell further comprising:
a source line in a substrate;
a drain line in the substrate;
a control gate above the substrate and between the source line and the drain line;
a floating gate above the substrate and partially overlapping the control gate and the source line;
a select gate above the substrate and between the drain line and the control gate; and
a diffusion region in the substrate separating the select gate from the control gate line, wherein a voltage applied to the select gate or the drain line is below a voltage level that may damage a gate oxide separating the select gate from the substrate.

* * * * *